United States Patent
Rascuná et al.

(10) Patent No.: US 12,249,624 B2
(45) Date of Patent: Mar. 11, 2025

(54) OHMIC CONTACT FORMATION IN A SIC-BASED ELECTRONIC DEVICE

(71) Applicant: STMICROELECTRONICS S.R.L., Agrate Brianza (IT)

(72) Inventors: Simone Rascuná, Catania (IT); Mario Giuseppe Saggio, Aci Bonaccorsi (IT); Giovanni Franco, Viagrande (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 448 days.

(21) Appl. No.: 17/225,998

(22) Filed: Apr. 8, 2021

(65) Prior Publication Data

US 2021/0328022 A1    Oct. 21, 2021

(30) Foreign Application Priority Data

Apr. 17, 2020 (IT) .................. 102020000008179

(51) Int. Cl.
*H01L 29/45* (2006.01)
*H01L 21/268* (2006.01)
*H01L 29/16* (2006.01)

(52) U.S. Cl.
CPC ...... *H01L 29/1608* (2013.01); *H01L 21/2686* (2013.01); *H01L 29/456* (2013.01)

(58) Field of Classification Search
CPC ............ H01L 29/1608; H01L 29/7804; H01L 29/7805; H01L 21/02529; H01L 21/02378; H01L 21/02447
See application file for complete search history.

(56) References Cited

U.S. PATENT DOCUMENTS

| | | |
|---|---|---|
| 8,962,468 B1 | 2/2015 | Hostetler |
| 2005/0104072 A1 | 5/2005 | Slater et al. |
| 2006/0192256 A1 | 8/2006 | Cooper et al. |
| 2007/0066039 A1 | 3/2007 | Agarwal et al. |

(Continued)

FOREIGN PATENT DOCUMENTS

| | | |
|---|---|---|
| CN | 109037041 A | 12/2018 |
| CN | 109326657 A | 2/2019 |

(Continued)

OTHER PUBLICATIONS

"Low-temperature, site selective graphitization of SiC via ion implantation and pulsed laser annealing" by Maxime Lemaitre et al. in Applied Physics Letters 100, 193105 (Year: 2012).*

(Continued)

*Primary Examiner* — Eric A. Ward
(74) *Attorney, Agent, or Firm* — Seed IP Law Group LLP

(57) ABSTRACT

A method for manufacturing a SiC-based electronic device, comprising the steps of: implanting, on a front side of a solid body made of SiC having a conductivity of an N type, dopant species of a P type thus forming an implanted region, which extends in the solid body starting from the front side and has a top surface coplanar with the front side; and generating a laser beam directed towards the implanted region in order to generate heating of the implanted region to temperatures comprised between 1500° C. and 2600° C. so as to form a carbon-rich electrical-contact region at the implanted region. The carbon-rich electrical-contact region forms an ohmic contact.

16 Claims, 10 Drawing Sheets

(56) References Cited

U.S. PATENT DOCUMENTS

| | | |
|---|---|---|
| 2008/0099769 A1 | 5/2008 | Rupp et al. |
| 2009/0289262 A1 | 11/2009 | Zhang et al. |
| 2011/0266558 A1 | 11/2011 | Yano |
| 2013/0020585 A1 | 1/2013 | Ishibashi |
| 2013/0062620 A1 | 3/2013 | Henning et al. |
| 2013/0313573 A1 | 11/2013 | Mizukami et al. |
| 2015/0091022 A1 | 4/2015 | Kawaguchi et al. |
| 2015/0214164 A1 | 7/2015 | Matocha et al. |
| 2015/0372093 A1 | 12/2015 | Saggio et al. |
| 2016/0181388 A1 | 6/2016 | Konrath et al. |
| 2017/0077087 A1* | 3/2017 | Horikawa ............... H01L 29/06 |
| 2017/0170280 A1 | 6/2017 | Wakabayshi et al. |
| 2017/0271324 A1* | 9/2017 | Kumagai .......... H01L 29/66068 |
| 2017/0309720 A1 | 10/2017 | Joshi et al. |
| 2018/0019309 A1* | 1/2018 | Radhakrishnan ..... H01L 21/045 |
| 2018/0097103 A1* | 4/2018 | Sadamatsu .......... H01L 29/7805 |
| 2018/0175153 A1 | 6/2018 | Schulze et al. |
| 2018/0190651 A1 | 7/2018 | Siemieniec et al. |
| 2019/0081170 A1* | 3/2019 | Kumagai ............. H01L 27/088 |
| 2020/0044031 A1 | 2/2020 | Pham et al. |
| 2020/0083365 A1 | 3/2020 | Konstantinov |
| 2020/0258996 A1 | 8/2020 | Ohse |
| 2020/0303564 A1 | 9/2020 | Rascuna' et al. |
| 2021/0280424 A1 | 9/2021 | Rascuna' et al. |
| 2021/0328023 A1 | 10/2021 | Rascuná et al. |
| 2021/0399154 A1 | 12/2021 | Rascuná et al. |
| 2023/0282757 A1 | 9/2023 | Rascuná et al. |
| 2023/0343831 A1 | 10/2023 | Rascuna' et al. |
| 2023/0411158 A1 | 12/2023 | Rascuna' et al. |

FOREIGN PATENT DOCUMENTS

| | | |
|---|---|---|
| JP | 2011071281 A | 4/2011 |
| JP | 2014063948 A | 4/2014 |
| JP | 2014127660 A | 7/2014 |
| JP | 2015153789 A | 8/2015 |
| WO | 2015178024 A1 | 11/2015 |

OTHER PUBLICATIONS

"Catalytic graphitization and Ohmic contact formation on 4H-SiC" by Weijie Lu et al. in J. Appl. Phys. 93, 5397-5403 (Year: 2003).*

"Silicon carbide for power devices" by J.W. Palmour, R. Singh, R.C. Glass, 0. Kordina, and C.H. Carter, Jr. in Proceedings of 9th International Symposium on Power Semiconductor Devices and IC's, May 26-29, 1997, available online Aug. 6, 2002 (Year: 2002).*

Badala, P. et al., "Ni/4H-SiC interaction and silicide formation under excimer laser annealing for ohmic contact," *Materialia 9 100528*, 2020, 6 pages.

Kusdemir, E. et al., "Epitaxial graphene contact electrode for silicon carbide based ultraviolet photodetector," *Journal of Phys. D: Appl. Phys.* vol. 48, 2015, p. 1-6.

Lebedev, A. et al., "Low temperature transport properties of multigraphene structures on 6H-SiC obtained by thermal graphitization: evidences of a presence of nearly perfect graphene layer," *Cornell University* URL=https://arxiv.org/abs/1212.4272, downloaded on Dec. 18, 2012, 8 pages.

Lemaitre, M. et al., "Low-temperature, site selective graphitization of SiC via ion implantation and pulsed laser annealing," *Applied Physics Letters*, vol. 100, May 8, 2012, p. 193105-1-193105-4.

Lioliou, G. et al., "Electrical and ultraviolet characterization of 4H-SiC Schottky photodiodes," *Optics Express 21657*, vol. 23, No. 17, 2015, 14 pages.

Liu et al., "Visible blind p+/p/n−/n+ UV 4H-SiC photodiodes based on 4H-SiC homeopilayers," *2006 8th International Conference on Solid-State and Integrated Circuit Technology Proceedings*, Oct. 2006, pp. 866-868.

Liu, F. et al., "Enhanced Ohmic contact via graphitization of polycrystalline silicon carbide," *Applied Physics Letters*, vol. 97, 2010, p. 262107-1-262107-3.

Lu, W. et al., "Catalytic graphitization and Ohmic contact formation on 4H-SiC," *Journal of Applied Physics*, vol. 93, No. 9, May 1, 2003 p. 5397-5403.

Mazzamuto, F. et al., "Low thermal budget ohmic contact formation by laser anneal," *Materials Sciemnce Forum*, vol. 858, 2016, 4 pages.

Rascuna, S. et al., "Morphological and electrical properties of Nickel based Ohmic contacts formed by laser annealing process on n-type 4H-SiC," *Manuscript submitted to Materials Science in Semiconductor Processing*, Nov. 20, 2018, 7 pages.

U.S. Appl. No. 17/190,722, filed Mar. 3, 2021.
U.S. Appl. No. 18/459,273, filed Aug. 31, 2023.
U.S. Appl. No. 17/226,003, filed Apr. 8, 2021.
U.S. Appl. No. 18/309,584, filed Apr. 28, 2023.
U.S. Appl. No. 17/344,558, filed Jun. 10, 2021.
U.S. Appl. No. 18/181,409, filed Mar. 9, 2023.

* cited by examiner

OHMIC CONTACT FORMATION IN A SIC-BASED ELECTRONIC DEVICE

BACKGROUND

Technical Field

The present disclosure relates to a SiC-based electronic device and a method for manufacturing the SiC-based electronic device. In particular, the present disclosure relates to the formation of electrical contact regions of an ohmic type in the SiC-based electronic device.

Description of the Related Art

As is known, the semiconductor materials, which have a wide band gap, in particular, an energy value Eg of the band gap higher than 1.1 eV, a low ON-state resistance (Rory), a high thermal conductivity value, a high operating frequency and a high rate of saturation of the charge carriers, are ideal for producing electronic components, such as diodes or transistors, in particular for power applications. A material having the above characteristics, and designed to be used for the manufacture of electronic components, is silicon carbide (SiC). In particular, the silicon carbide, in its different polytypes (for example, 3C—SiC, 4H—SiC, 6H—SiC), is preferable to silicon, as regards the properties listed previously.

Electronic devices provided on a silicon-carbide substrate, as compared to similar devices provided on a silicon substrate, have numerous advantages, such as low output resistance in conduction, low leakage current, high operating temperature and high operating frequencies. In particular, SiC Schottky diodes have shown a higher switching performance, which render SiC electronic devices particularly favorable for high-frequency applications. Current applications impose requisites on the electrical properties and also on long-term reliability of the devices.

BRIEF SUMMARY

The present disclosure is to provide a SiC-based electronic device and a method for manufacturing the SiC-based electronic device, such as to overcome the drawbacks of the prior art.

The present disclosure is directed to a metal oxide semiconductor field effect transistor (MOSFET) that includes a substrate having a first conductivity type and a first surface and a second surface and a first doped region having a second conductivity type. There is a second doped region in the first doped region, the second doped region having the first conductivity type and a first gate on the first surface that overlaps a first edge of the second doped region. A second gate on the first surface that overlaps a second edge of the second doped region and a first ohmic contact between the first gate and the second gate, the first ohmic contact being in the second doped region, the first ohmic contact being between the first surface and the second surface of the substrate.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
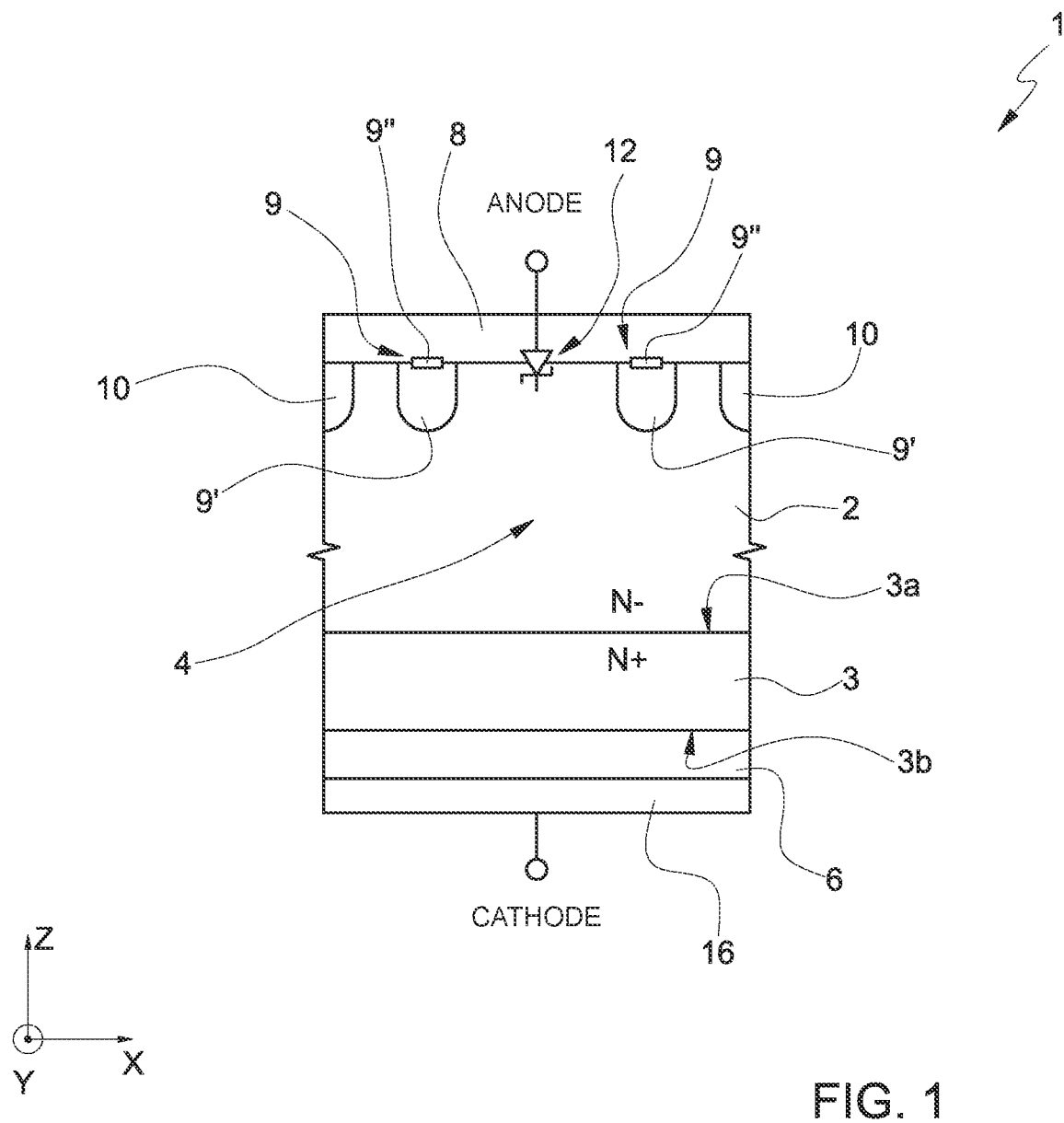
FIG. 1 shows, in cross-sectional view, an MPS device according to a known embodiment.

FIG. 1 shows, in side sectional or cross-sectional view in a (triaxial) Cartesian reference system of axes X, Y, Z, a merged-PiN-Schottky (MPS) device 1 of a known type.

The MPS device 1 includes: a substrate 3, made of SiC of an N type, having a first dopant concentration, provided with a surface 3a opposite to a surface 3b, and having a thickness of approximately 350 µm; a drift layer (grown in an epitaxial way) 2, made of SiC of an N type, having a second dopant concentration lower than the first dopant concentration, which extends over the surface 3a of the substrate 3, and has a thickness comprised between 5 and 15 µm; an ohmic contact region 6 (for example, made of nickel silicide), which extends over the surface 3b of the substrate 3; a cathode metallization 16, which extends over the ohmic contact region 6; an anode metallization 8, which extends over a top surface 2a of the drift layer 2; multiple junction-barrier (JB) elements 9 in the drift layer 2, which face the top surface 2a of the drift layer 2 and each include a respective implanted region 9' of a P type and an ohmic contact 9" made of metal material; and an edge-termination region, or protection ring, 10 (optional), in particular an implanted region of a P type, which surrounds the JB elements 9 completely.

Schottky diodes 12 are formed at the interface between the drift layer 2 and the anode metallization 8. In particular, Schottky junctions (semiconductor-metal) are formed by portions of the drift layer 2 in direct electrical contact with respective portions of the anode metallization 8.

The region of the MPS device 1 that includes the JB elements 9 and the Schottky diodes 12 (i.e., the region contained within the protection ring 10) is an active area 4 of the MPS device 1.

Figure 2A:
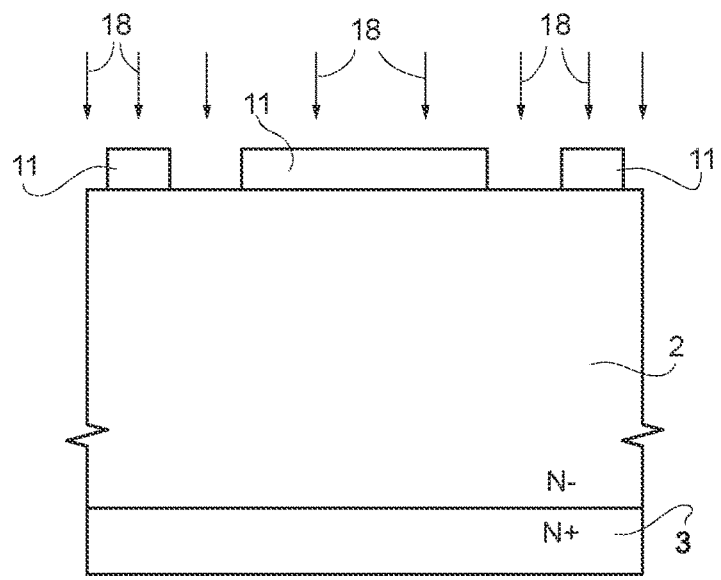
FIGS. 2A and 2B show, in cross-sectional view, intermediate steps for manufacturing the MPS device of FIG. 1, according to the known art.
Figure 2B:
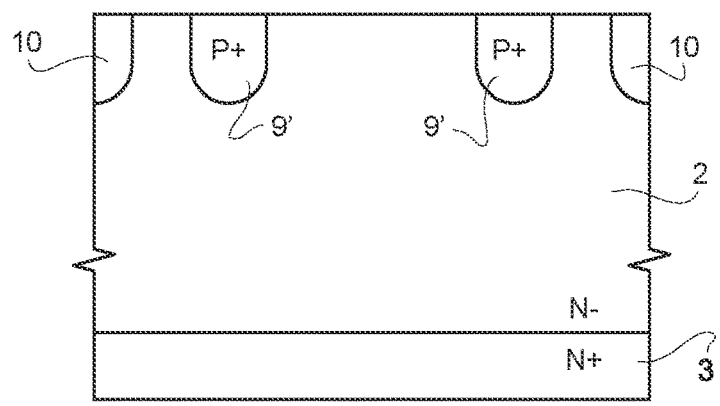

With reference to FIGS. 2A and 2B, the steps for manufacturing the MPS device 1 of FIG. 1 envisage (FIG. 2A) a step of masked implantation of dopant species (for example, boron or aluminum), which have the second conductivity type (P). The implantation is illustrated by arrows 18 in FIG. 2A. For the implantation, a mask 11 is used, in particular a hard mask made of silicon oxide or Tetraethyl orthosilicate (TEOS). Implanted regions 9' and the edge-termination region 10 are thus formed. Then, FIG. 2B, the mask 11 is removed, and a step of thermal annealing is carried out for diffusion and activation of the dopant species implanted in the step of FIG. 2A. The thermal annealing is, for example, carried out at a temperature higher than 1600° C. (for example, between 1700° C. and 1900° C. and in some cases even higher).

Figure 3A:
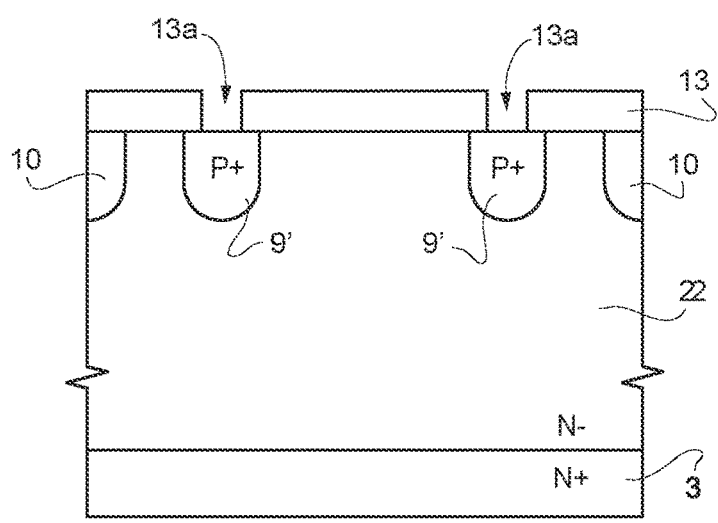
FIGS. 3A-3C show, in cross-sectional view, steps for ohmic contact formation in the MPS device of FIG. 1, subsequent to the steps of FIGS. 2A and 2B, according to the known art.
Figure 3B:
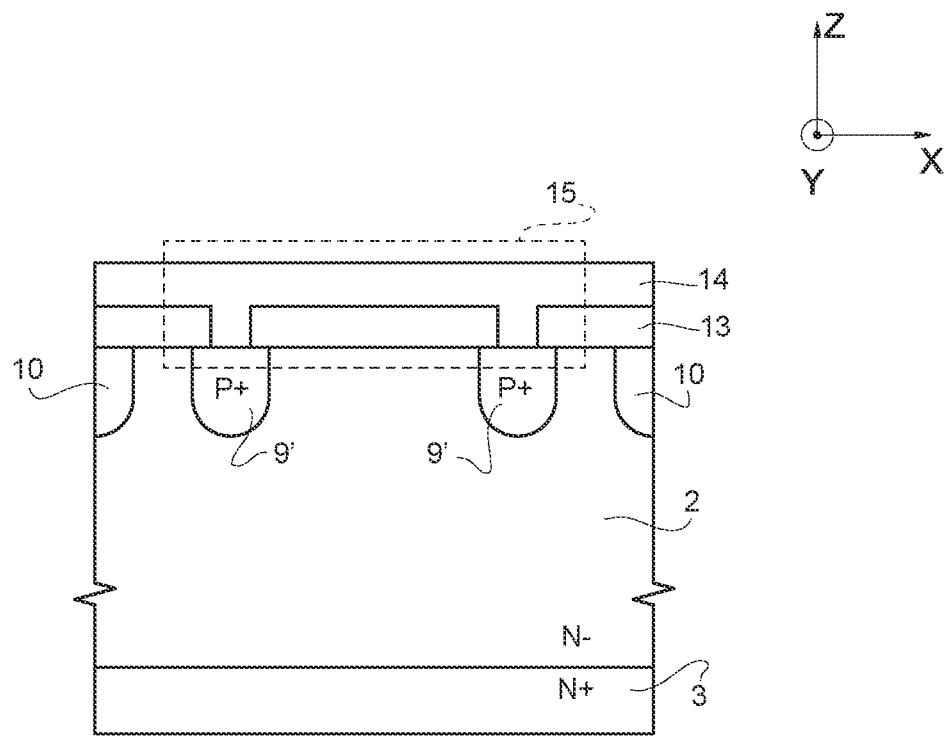
Figure 3C:
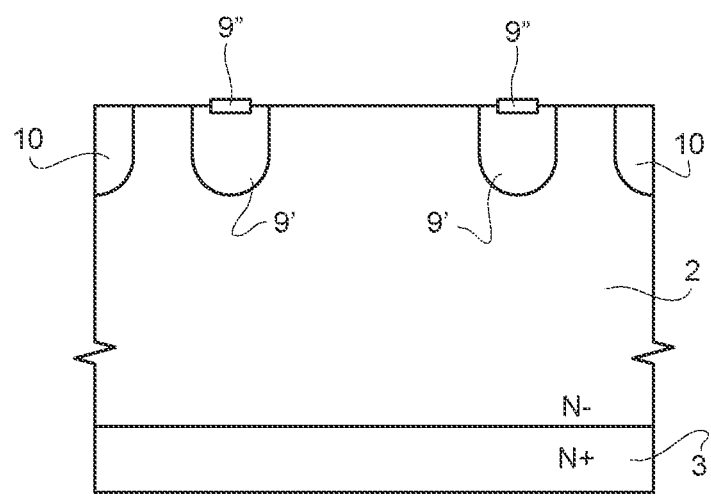

With reference to FIGS. 3A-3C, further steps of ohmic contact 9" formation are then carried out. With reference to FIG. 3A, a deposition mask 13 made of silicon oxide or TEOS is formed, to cover surface regions of the drift layer 2 other than the implanted regions 9' (and the edge-termination region 10, if present). In other words, the mask 13 has through openings 13a at the implanted regions 9' (and optionally at least one portion of the edge-termination region 10). Then, FIG. 3B, a deposition of nickel is performed on the mask 13 and within the through openings 13a (the metal layer 14 in FIG. 3B). The nickel thus deposited reaches and contacts the implanted regions 9' and the edge-termination region 10 through the through openings 13a.

With reference to FIG. 3C, a subsequent thermal annealing at high temperature (between 900° C. and 1200° C.) for a time interval from 1 min to 120 min, enables formation of nickel-silicide ohmic contacts 9", by chemical reaction between the nickel deposited and the silicon of the drift layer 2 at the through openings 13a. In fact, the deposited nickel reacts where it comes into contact with the surface material of the drift layer 2, forming $Ni_2Si$ (i.e., the ohmic contact). Next, a step of removal of the metal that extends over of the mask 13 and removal of the mask 13 is carried out.

Figure 4:
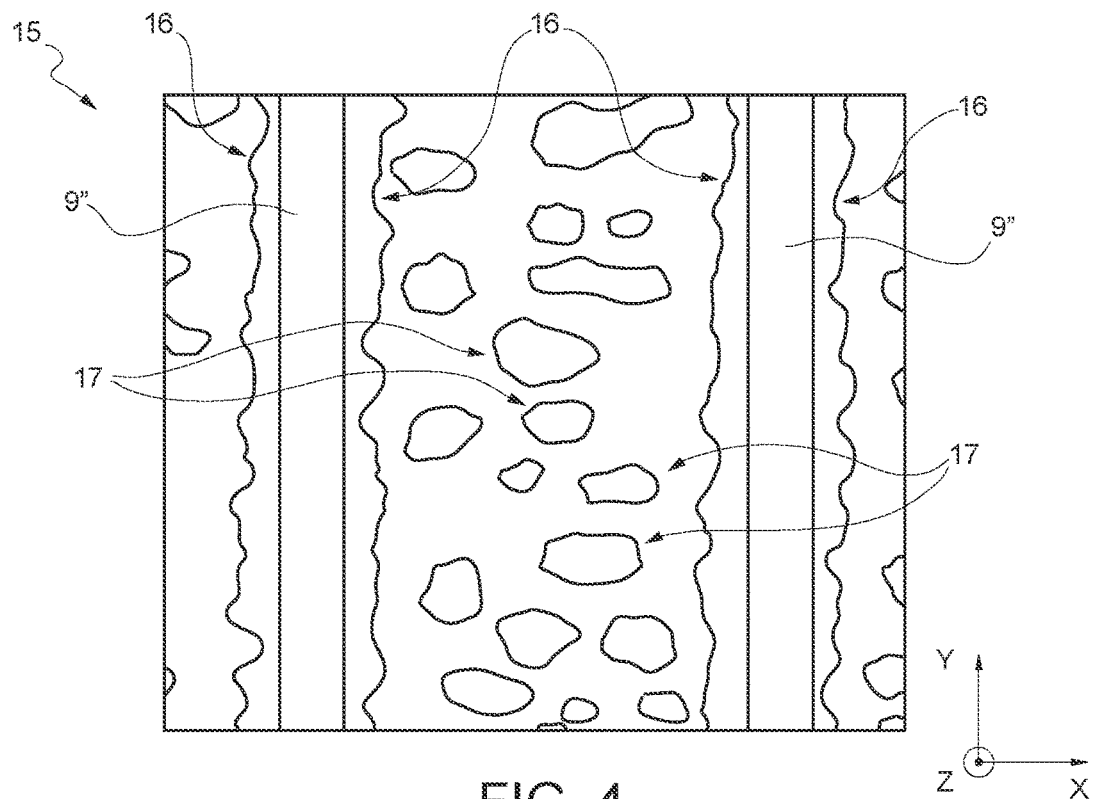
FIG. 4 illustrates, in top view, undesired regions that have formed as a result of the manufacturing steps of FIGS. 3A-3B, according to the known art.

The present applicant has found that an albeit limited reaction occurs in any case between the nickel of the metal layer 14 and the mask 13, where they are in direct contact, as illustrated by way of example in FIG. 4. FIG. 4 is a top view, in the plane XY, of a portion of the device of FIG. 3B, in particular of the region delimited by a dashed line and identified by the reference number 15 in FIG. 3B. FIG. 4 regards a manufacturing step intermediate between the steps of FIG. 3B and FIG. 3C, i.e., with the mask 13 still present but with the nickel layer 14 removed. As may be noted from FIG. 4, irregular regions, or islands 17 extend over the mask 13 and are due to an undesired reaction between the nickel and the silicon of the mask 13. The applicant has moreover noted that similar indented regions extend underneath the mask 13, i.e., on the surface 2a of the drift layer 2. In FIG. 4, these indented regions are identified by the reference number 16 and are made of conductive material (including nickel). In the case where the extension in the plane XY, in particular along X, of said indented regions 16 were greater than the corresponding extension of the implanted regions 9', there would occur a short-circuit that would lead to breakdown of the device. In detail, in the case where the undesired conductive regions were to extend in the area dedicated to the Schottky contact, an ohmic contact or quasi-ohmic contact (Schottky contact with low barrier) would be formed on an area of an N type (which from the electrical standpoint is a resistance); there would therefore be a continuous passage of current both in forward biasing and in reverse biasing, with a consequent loss of the diode characteristics.

The same problem is encountered during ohmic contact formation at body and source regions of a SiC MOSFET device.

Figure 5:
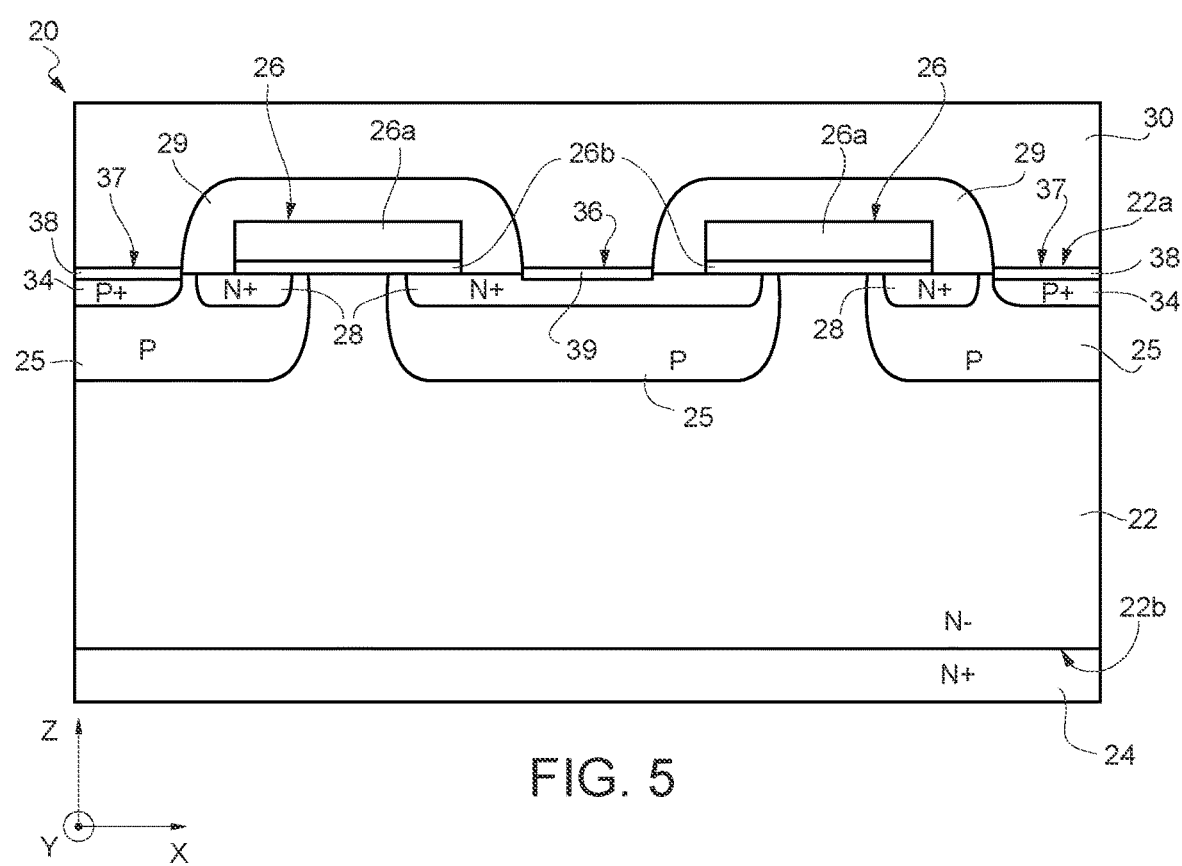
FIG. 5 shows, in cross-sectional view, a MOSFET device according to a known embodiment.

FIG. 5 shows a MOSFET device 20 that comprises a semiconductor body 22, made of semiconductor material (which includes a substrate and, optionally, one or more epitaxial layers), having a top surface 22a and a bottom surface 22b. The semiconductor body 22 has, for example, an N-doping. A drain or doped region 24, for example formed by implanting dopant species of an N type (N+ doping), extends at the bottom surface 22b. At the top surface 22a body regions 25 (with a P doping) surround the source regions 28 (N+ doping). The gate structures 26, including a stack formed by a gate conductive layer 26a (e.g., polysilicon) and by a gate dielectric layer 26b, extend over the top surface 22a, in part overlapping the source or doped regions 28. A respective insulating, or dielectric, layer 29 (for example, made of silicon oxide or TEOS) covers the gate structures 26.

A top metal layer 30 is in electrical contact with the source regions 28 and the body regions 25, respectively, at respective surface portions 36 and 37 in order to bias, during use, the source regions 28 and the body regions 25 at a same biasing voltage.

To improve the electrical contact between the top metal layer 30 and the body regions 25, an interface region (with P+ doping) 34 is formed in the body regions 25, facing the top surface 22a at the surface portion 37. Typically, an interface ohmic contact layer 38 made of silicide is formed at the interface region 34 to form an ohmic contact between the metal 30 and the body region 25. Likewise, a further interface ohmic contact layer 39 made of silicide is formed at the surface portion 36 to form an ohmic contact between the metal 30 and the source region 28.

As described with reference to FIGS. 3A-3C, formation of the interface ohmic contact layers 38 and 39 envisages deposition of an intermediate metal layer, in particular a nickel, using the insulating layer 29, in a way similar to what has been described previously for the mask 13. This intermediate metal layer therefore extends over the insulating layer 29 and over the surface portions 36 and 37 in contact with the interface region 34 and the source region 28.

As described with reference to FIG. 3C, a subsequent thermal annealing at high temperature (between 900° C. and 1200° C. for a time interval from 1 min to 120 min), enables formation of ohmic contacts made of nickel silicide, by chemical reaction between the deposited nickel and the silicon of the semiconductor body 22, at the surface portions 36 and 37 (more in particular, at the interface region 34 and the source region 28). Next, a step of removal of the metal that extends over of the insulating layer 29 is carried out. The insulating layer 29, which has a function in the end device, is not removed.

However, as described previously, the applicant has noted a reaction between the nickel of the metal layer 14 and the insulating layer 29 where they are in direct contact (similarly to what is illustrated in FIG. 4). Irregular regions, or islands, consequently extend over the insulating layer 29 and are due to an undesired reaction between the nickel and the silicon of the insulating layer 29. Since these islands are electrically conductive, they are a potential problem for operation of the device 20, above all in the case where their extension were such as to generate undesired short-circuits or other types of unexpected electrical connection. Insulation of the polysilicon 26 via covering of the oxide 29 is not uniform, and usually has a minimum at the highest point of the polysilicon step 26. If the reaction of the nickel with the silicon of the oxide occurs in this area, there is a high risk of creating a gate-to-source short-circuit owing to formation of a bridge between the metal 30 and the polysilicon 26.

The present disclosure will be described with reference to two possible embodiments, specifically with reference to a merged-PiN-Schottky (MPS) device (FIGS. 6, 7A-7D) and with reference to a MOSFET device (FIGS. 9-11); however, as will be evident from the ensuing description, the present disclosure applies in general to any SiC-based electronic device.

Figure 6:
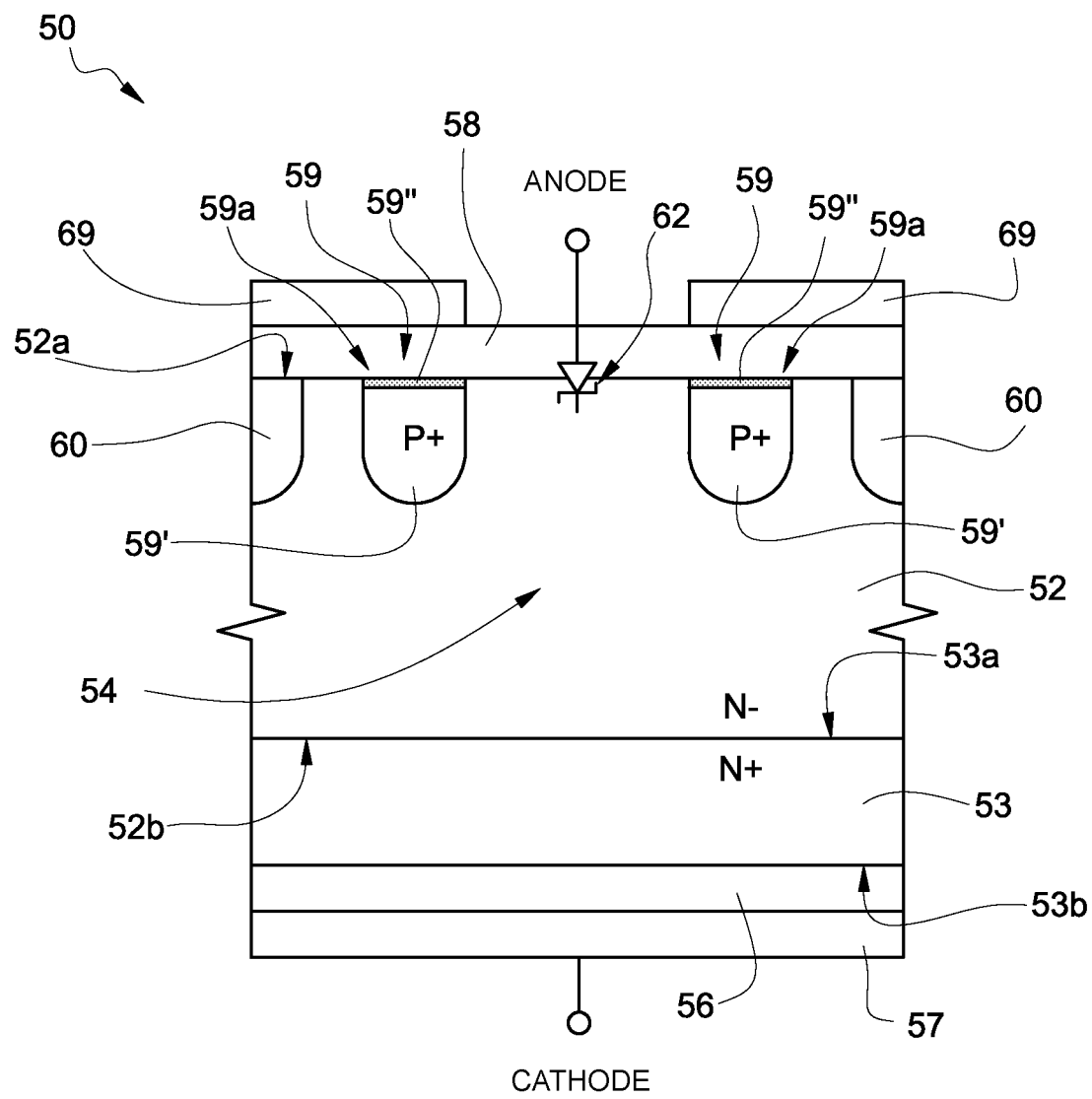
FIG. 6 shows, in cross-sectional view, an MPS device according to one embodiment of the present disclosure.

FIG. 6 shows, in side sectional or cross-sectional view in a (triaxial) Cartesian reference system with axes X, Y, Z, a Merged-PiN-Schottky (MPS) device 50 according to one aspect of the present disclosure.

The MPS device 50 includes: a substrate 53, made of silicon carbide (SiC) of an N type, having a first dopant concentration, provided with a surface 53a opposite to a surface 53b, and having a thickness in the range of 50 μm and 350 μm, more in particular between 160 μm and 200 μm, for example substantially equal to 180 μm; a drift layer (grown in an epitaxial way) 52, made of SiC of an N type, having a second dopant concentration lower than the first dopant concentration, which extends over the surface 53a of the substrate 53, and has a thickness comprised between 5 and 15 μm; an ohmic contact region, or layer, 56 (for example, made of nickel silicide), which extends over the surface 53b of the substrate 53; a cathode metallization 57, made, for example, of titanium nickel vanadium silver (Ti/NiV/Ag) or titanium nickel vanadium gold (Ti/NiV/Au), which extends over the ohmic contact region 56; an anode metallization 58, made, for example, of titanium aluminum silicon copper (Ti/AlSiCu) or nickel aluminum silicon copper (Ni/AlSiCu), which extends over a top surface 52a of the drift layer 52; a passivation layer 69 on the anode metallization 58, for protecting the latter; multiple junction-barrier (JB) elements 59 in the drift layer 52, which face the top surface 52a of the drift layer 52 and each include a respective implanted region 59' of a P type and an ohmic contact 59"; and an edge-termination region, or protection ring, 60 (optional), in particular an implanted region of a P type, which completely surrounds the junction-barrier elements 59.

One or more Schottky diodes 62 are formed at the interface between the drift layer 52 and the anode metallization 58, laterally to the implanted regions 59'. In particular, (semiconductor-metal) Schottky junctions are formed by portions of the drift layer 52 in direct electrical contact with respective portions of the anode metallization 58.

The region of the MPS device 50 that includes the JB elements 59 and the Schottky diodes 62 (i.e., the region contained within the protection ring 60) is an active area 54 of the MPS device 50.

According to one aspect of the present disclosure, each ohmic contact 59" is formed by one or more carbon-rich layers, including, for example, graphite layers, or graphene multi-layers. More in particular, each ohmic contact 59" has, on the surface 52a, a Si/C amorphous layer, where the carbon atoms are preponderant (for example, at least twice as high, in particular from 2 to 100 times as high) as compared to the silicon atoms, following upon phase separation between the silicon atoms and the carbon atoms of the SiC substrate. Underneath this amorphous layer, each ohmic contact 59" may include a layer including carbon clusters (e.g., a graphite layer), having a thickness greater than that of the amorphous layer. Such an ohmic contact 59" formation is due to thermal decomposition of the silicon carbide, as a result of the manufacturing process illustrated in what follows.

According to a further aspect of the present disclosure, the ohmic contacts 59" are self-aligned, on the surface 52a, with the implanted regions 59' (i.e., in top view in the plane XY, the ohmic contacts 59" have the same shape and extension as the implanted regions 59'). In this case, the electrical contact between the anode metallization 58 and the implanted regions 59' occurs exclusively through the ohmic contacts 59". This feature translates into a technical advantage, in that it is possible to maximize the extension area of the ohmic contacts without the risk of short circuiting with neighboring ohmic contacts. In fact, since each ohmic contact 59" has the same shape and extension as the respective implanted region 59', there is no risk of an undesirable lateral extension of said ohmic contact beyond such implanted region 59'. Maximizing the area of the ohmic contact allows maximizing the current carried by said ohmic contact.

Moreover, according to a further aspect of the present disclosure, the ohmic contacts 59" do not extend, along Z, beyond the surface 52a; in other words, the ohmic contacts 59" have a top surface 59a that is coplanar (i.e., aligned along X) with the surface 52a and extend in depth (along Z) within the ohmic contacts 59' by a depth comprised between one nanometer and some tens of nanometers (e.g., between 1 m and 20 m) measured starting from the surface 52a.

Each ohmic contact 59" provides an electrical connection having an electrical resistivity value lower than the electrical resistivity value of the region that houses it. In particular, each ohmic contact 59" has an electrical resistance lower than the electrical resistance of the respective region 59' that houses it.

The steps of the ohmic contact 59' formation are described in what follows, with explicit reference to the steps for manufacturing the MPS device 50 (FIGS. 7A-7D).

Figure 7A:
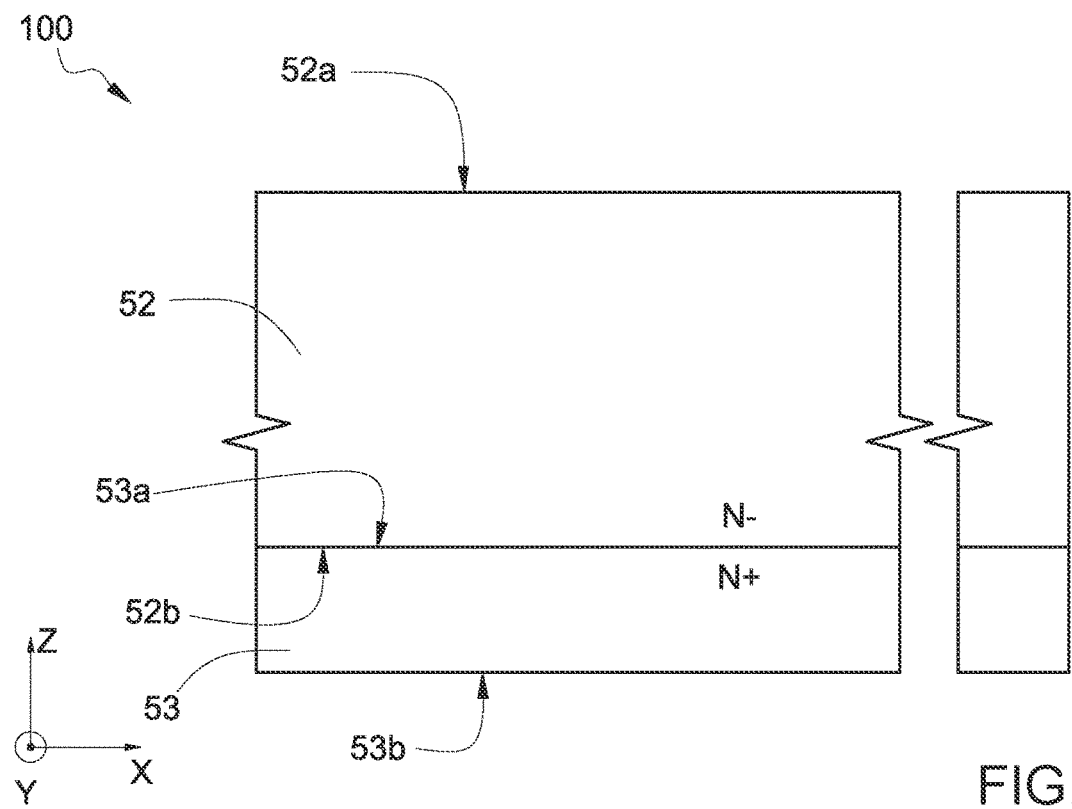
FIGS. 7A-7D illustrate, in cross-sectional view, steps for manufacturing the MPS device of FIG. 6, according to the present disclosure.

With reference to FIG. 7A, a wafer 100 is provided, which includes a SiC substrate 53 (in particular, 4H—SiC; however, other polytypes may be used such as, but not exclusively, 2H—SiC, 3C—SiC and 6H—SiC).

The substrate 53 has a first conductivity type (in this embodiment, a doping of an N type) and is provided with a front surface 53a and a back surface 53b, which are opposite to one another along the axis Z. The substrate 53 has a dopant concentration comprised between $1 \cdot 10^{19}$ and $1 \cdot 10^{22}$ atoms/cm$^3$.

The front of the wafer 100 corresponds to the front surface 53a, and the back of the wafer 100 corresponds to the back surface 53b. The resistivity of the substrate 30 is, for example, comprised between 2 mΩ·cm and 40 mΩ·cm.

Formed on the front surface 53a of the substrate 53, for example by epitaxial growth, is the drift layer 52, made of silicon carbide with the first conductivity type (N) and with a dopant concentration lower than that of the substrate 53, for example comprised between $1 \cdot 10^{14}$ and $5 \cdot 10^{16}$ atoms/cm$^3$. The drift layer 52 is made of SiC, in particular 4H—SiC, but it is possible to use other SiC polytypes, such as 2H, 6H, 3C or 15R.

The drift layer 52 has a thickness defined between a top side 52a and a bottom side 52b (the latter being in direct contact with the front surface 53a of the substrate 53).

Figure 7B:
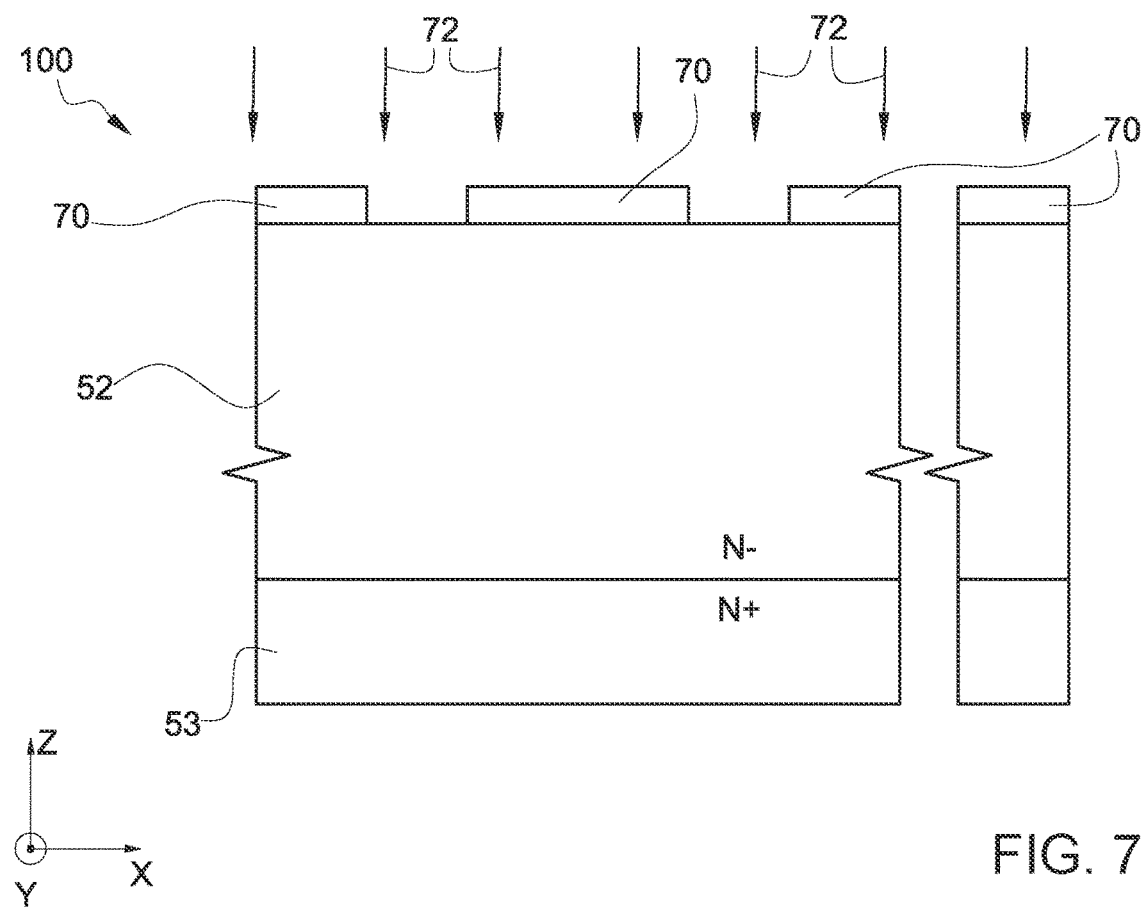

Then, FIG. 7B, on the top side 52a of the drift layer 52 a hard mask 70 is formed, for example by deposition of a photoresist, or TEOS or some other material designed for the purpose. The hard mask 70 has a thickness of between 0.5 μm and 2 μm or in any case a thickness such as to shield the implantation described hereinafter with reference to the same FIG. 7B. The hard mask 70 extends in a region of the wafer 100 where, in subsequent steps, the active area 54 of the MPS device 50 will be formed.

In top view, in the plane XY, the hard mask 70 covers the regions of the top side 52a of the drift layer 52 that will form Schottky cells (diodes 62) and leaves exposed the regions of the top side 52a of the drift layer 52 that will form the implanted regions 59', already identified with reference to FIG. 6.

Then a step of implantation of dopant species (for example, boron or aluminum) is carried out, which have the second conductivity type (here a P type), exploiting the hard mask 70 (the implantation is indicated in the figure by the arrows 72). During the step of FIG. 7B, the protection ring 60, if present, is also formed.

In an embodiment provided by way of example, the implantation step of FIG. 7B comprises one or more implantations of dopant species, which have the second conductivity type, with an implantation energy comprised between 30 keV and 400 keV and with doses of between $1 \cdot 10^{12}$ atoms/cm$^2$ and $1 \cdot 10^{15}$ atoms/cm$^2$, to form the implanted regions 59' with a dopant concentration of higher than $1 \cdot 10^{18}$ atoms/cm$^3$. Implanted regions are thus formed having a depth, measured starting from the surface 52a, comprised between 0.4 µm and 1 µm.

Figure 7C:
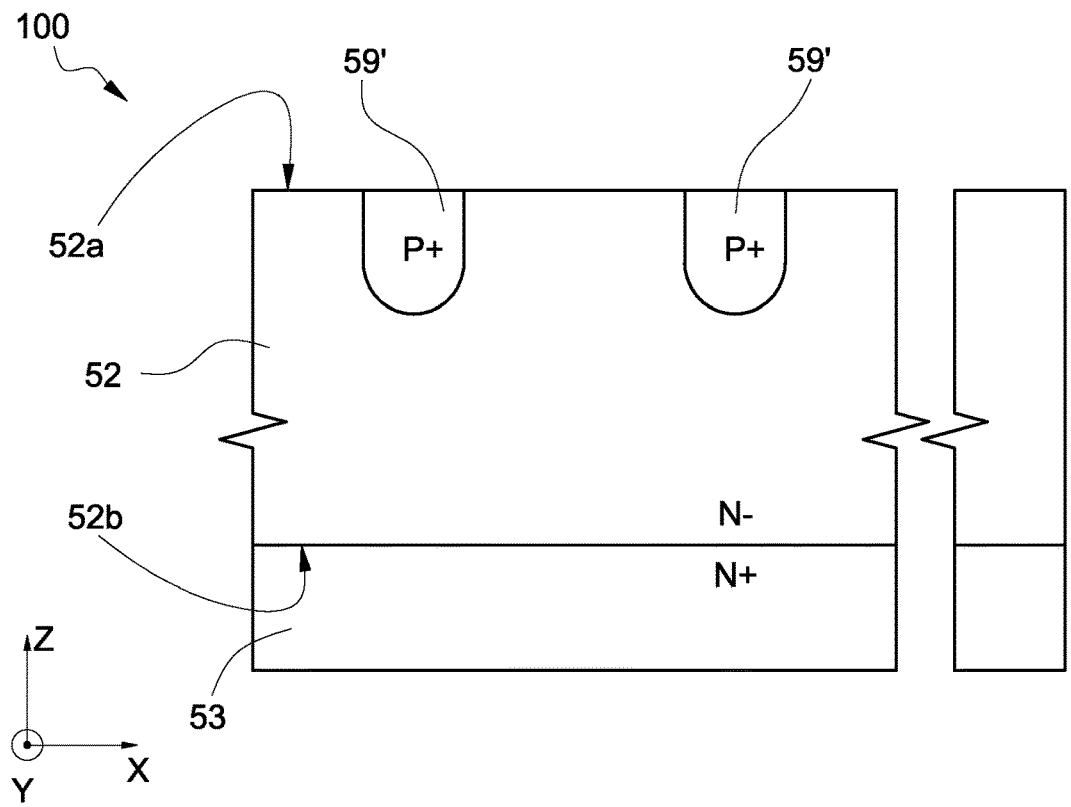
Figure 7D:
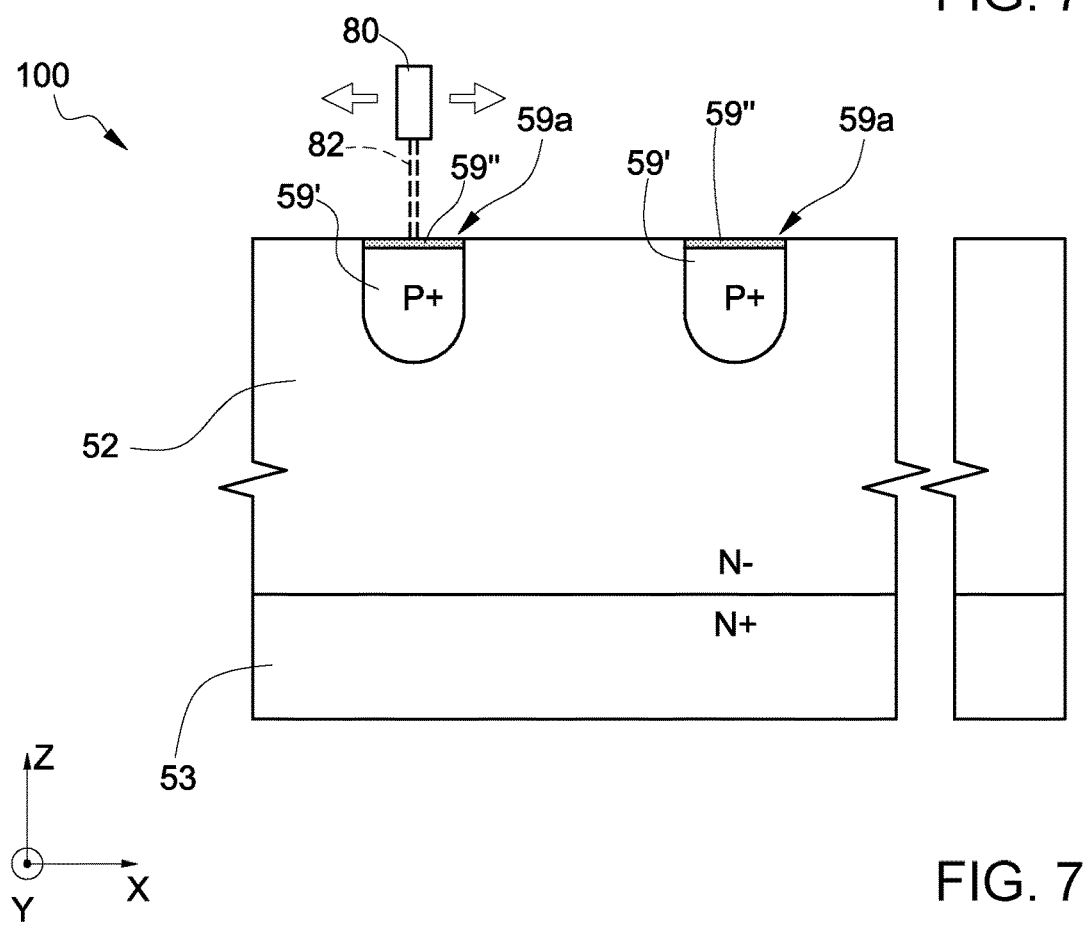

Next, FIG. 7C, the mask 70 is removed and, FIG. 7D, on the surface 52a a thermal budget is generated designed to favor generation, on the implanted regions 59'.

For this purpose, a laser source 80 is used configured to generate a beam 82 such as to heat the surface 52a (in particular, the implanted regions 59') locally up to a temperature of approximately 1500° C.-2600° C. Given the maximum depth of the implanted regions 59', a temperature of approximately 2000° C. at the level of the surface 52a is sufficient to guarantee temperatures within the range identified above also at the maximum depth reached by the implanted regions 59' (e.g., 1 µm).

This temperature is such as to favor generation of ohmic contacts (for example, as has been said, including graphite and/or graphene) exclusively on the implanted regions 59', and not on the surface 52a that is not provided with the implanted regions 59'. This effect, of a per se known type, is described for example by Maxime G. Lemaitre, "Low-temperature, site selective graphitization of SiC via ion implantation and pulsed laser annealing", APPLIED PHYSICS LETTERS 100, 193105 (2012).

In one embodiment, transformation of part of the implanted regions 59' into the ohmic contact 59" takes place by heating the entire wafer 100, appropriately moving the laser 80.

In a further embodiment, transformation of the surface portions of the implanted regions 59' into the ohmic contact 59" is obtained by heating the useful surface of the wafer 100. By "useful surface" is here meant the portion of surface of the drift layer 52 that includes the implanted regions 59', for example delimited externally by the edge-termination region 10. The useful surface might not correspond to the entire surface of the wafer 100 (for example, excluding possible portions of the wafer 100 that are lateral with respect to the active area 54, which are not of interest during use of the MPS device 50 in so far as they do not take part in transport of electric charge).

In a further embodiment, it is possible to arrange over the surface 52a (in contact with the surface 52a or at a distance therefrom) a mask having regions transparent to the beam 82 (i.e., the beam 82 traverses them) and regions opaque to the beam 82 (i.e., the beam 82 does not traverse them, or traverses them in attenuated form such as not to heat significantly the portions of the wafer 100 that extend underneath). The transparent regions of the mask are aligned with the implanted regions 59', to enable the ohmic contact 59" formation.

Optionally, and independent of the embodiment used, the implanted regions 59' (in particular, the dopants are activated, to obtain a concentration of dopant species comprised between approximately $1 \cdot 10^{17}$ atoms/cm$^3$ and $1 \cdot 10^{20}$ atoms/cm$^3$) are simultaneously formed and the ohmic contacts 59" for each implanted region.

Furthermore, since the ohmic contact is formed exclusively on the implanted regions 59', even in the absence of a mask there is a self-alignment between the implanted regions 59' and the respective ohmic contact 59".

At the implanted regions 59', the localized and superficial increase in temperature causes the ohmic contact 59" formation; laterally to the implanted regions 59', no such effect is noted. The ohmic contact 59" formation takes place at temperatures comprised between 1200° C. and 2600° C. According to the present disclosure, these temperatures are reached at a surface portion (some nanometers, e.g., 1-20 nm) of the implanted regions 59'. For greater depths, the temperature drops to values such as no longer to cause the ohmic contact 59" formation, which is thus self-limited. Therefore, the ohmic contact 59" does not extend throughout the thickness of the respective implanted region, but exclusively at a superficial level thereof.

The laser 80 is, for example, a UV excimer laser. Other types of lasers may be used, among which lasers with wavelengths in the region of the visible.

The parameters of configuration and actuation of the laser 80, optimized for achieving the purpose of the present disclosure, are the following:
wavelength: between 290 nm and 370 nm, in particular 310 nm;
pulse duration: between 100 ns and 300 ns, in particular 160 ns;
number of pulses: between 1 and 10, in particular 2;
energy density: between (2) 1.6 and 4 J/cm$^2$, in particular (3) 2.6 J/cm$^2$ (considered at the level of the surface 52a); and
temperature: between 1400° C. and 2600° C., in particular 1800° C. (considered at the level of the surface 52a).

The area of the spot of the beam 82 at the level of the surface 52a is, for example, comprised between 0.7 and 1.5 cm$^2$.

To cover the entire wafer 100, or the sub-region of the wafer 100 to be heated, one or more scans of the laser 80 are thus performed in the plane XY (e.g., a plurality of scans parallel to one another and to the axis X and/or axis Y).

Figure 8:
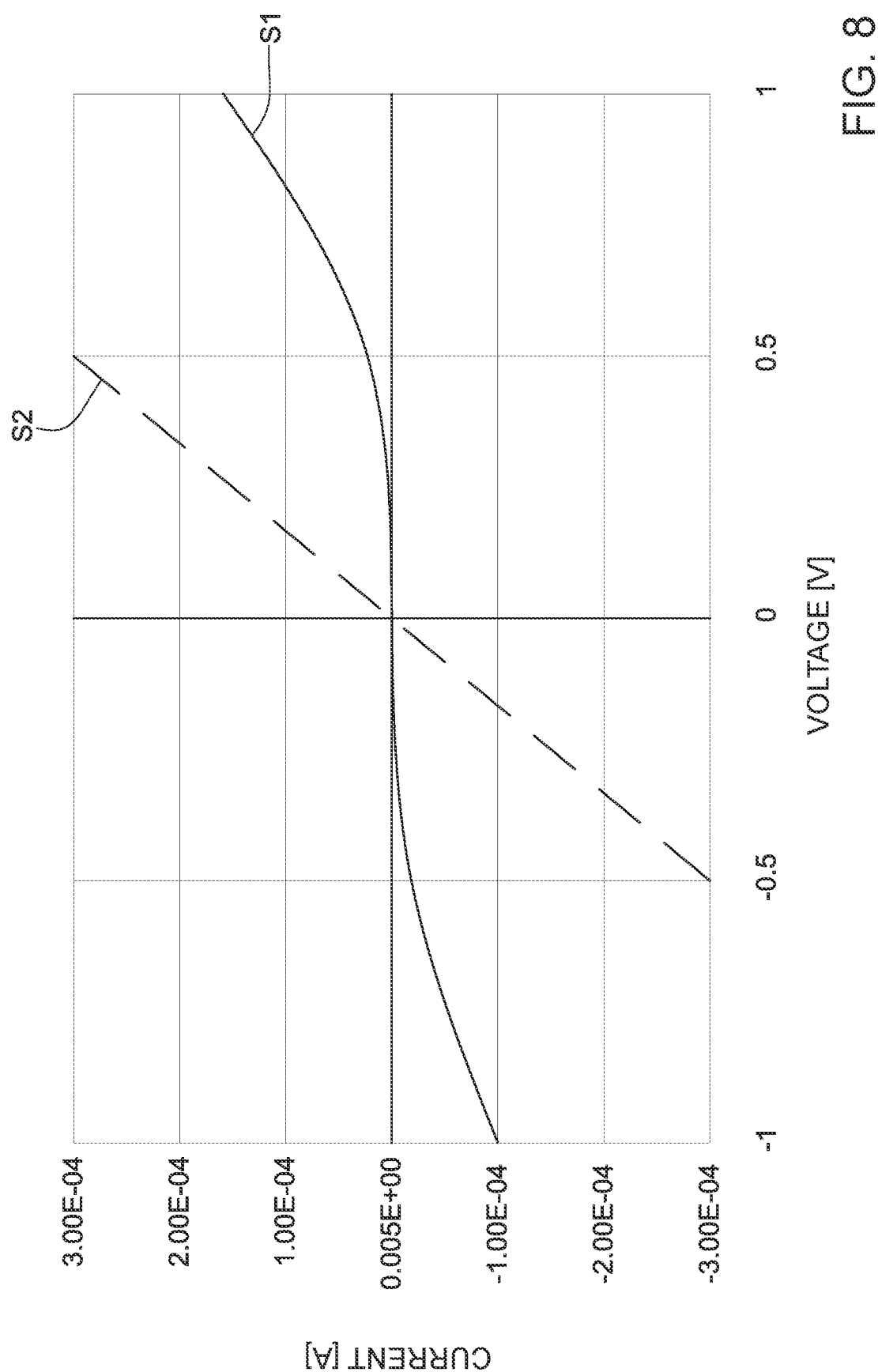
FIG. 8 illustrates voltage-current curves of the MPS device of FIG. 6.

The applicant has, however, found that, with the parameters identified previously, the desired electrical behavior is obtained for the MPS device 50. FIG. 8 illustrates, in this regard, experimental data of variation of the conduction current as a function of the voltage applied between anode and cathode of the MPS device 50. The curve Si relates to electrical measurements at the PiN diode prior to the laser treatment, whereas the curve S2 relates to electrical measurements at the PiN diode after laser treatment, and therefore with the ohmic contact formed. The trends of the curves S1 and S2 confirm the expected behavior.

Figure 9:
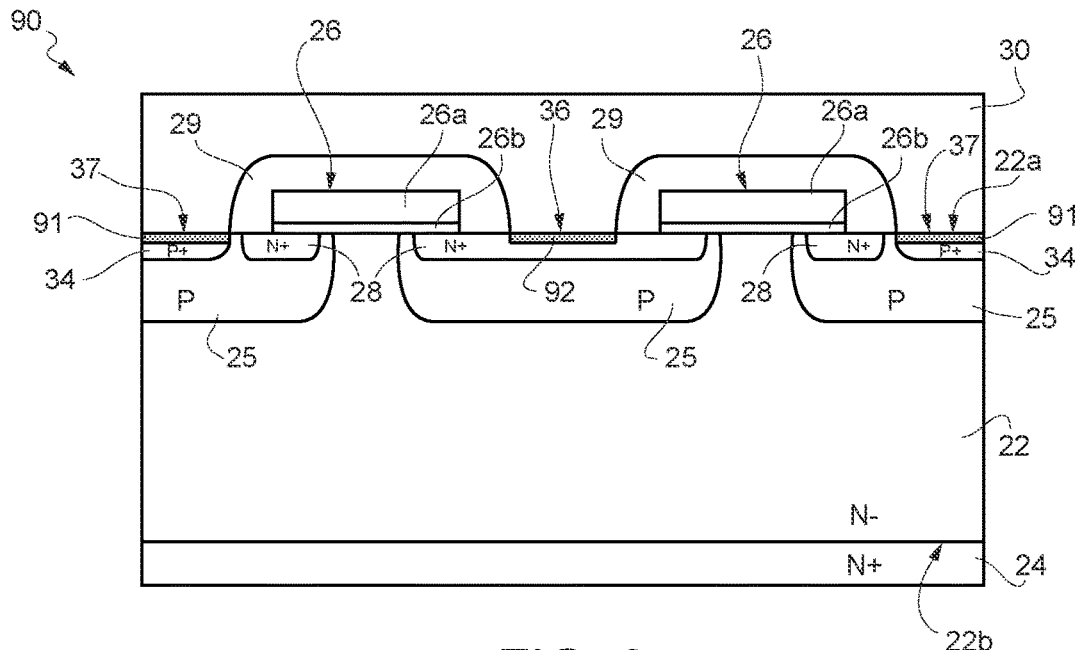
FIG. 9 illustrates, in cross-sectional view, a MOSFET device according to one embodiment of the present disclosure.

FIG. 9 shows a MOSFET device 90 according to an aspect of the present disclosure.

Technical elements and characteristics of the MOSFET device 90 that are common to the MOSFET device 20 of FIG. 5 are illustrated with the same reference numbers and are not described any further.

Unlike the MOSFET device 20, the MOSFET device 90 has an ohmic contact 91 at the interface region 34, between the metal 30 and the body region 25. The MOSFET device 90 moreover has a further ohmic contact 92 at the surface portion 36, between the metal 30 and the source region 28.

According to one aspect of the present disclosure, both the ohmic contact 91 and the ohmic contact 92 are formed by one or more carbon-rich or carbon based layers, which, for example, include layers with carbon, graphite layers, or graphene multi-layers. More in particular, each ohmic contact 91, 92 has, on the surface 52a, a Si/C amorphous layer in which the carbon atoms are preponderant (for example, at least twice as high, in particular from 2 to 100 times as high) as compared to that of the silicon atoms, following upon phase separation between the silicon atoms and the carbon atoms of the SiC substrate. Underneath this amorphous layer, each ohmic contact 91, 92 can have a layer including carbon clusters (e.g., a graphite layer), having a thickness greater than that of the amorphous layer. Such an ohmic contact 59" formation is due to thermal decomposition of silicon carbide, as a result of the manufacturing process illustrated in what follows.

According to a further aspect of the present disclosure, the ohmic contact 91 and the ohmic contact 92 are self-aligned, on the surface 22a, with the interface region 34 and with the source region 28 (i.e., in top view in the plane XY, the ohmic contacts 91, 92 have the same shape and extension as the interface region 34 and the source region 28, respectively).

The ohmic contacts 91 and 92 extend in depth (along Z) within the semiconductor body 22 by a depth comprised between one nanometer and some tens of nanometers (e.g., between 1 and 20 nm), measured starting from the surface 22a.

Each ohmic contact 91, 92 provides an electrical connection having an electrical resistivity value lower than the electrical resistivity value of the region that houses it. In particular, each ohmic contact 91, 92 has an electrical resistance lower than the electrical resistance of the respective region 34, 28 that houses it.

Figure 10:
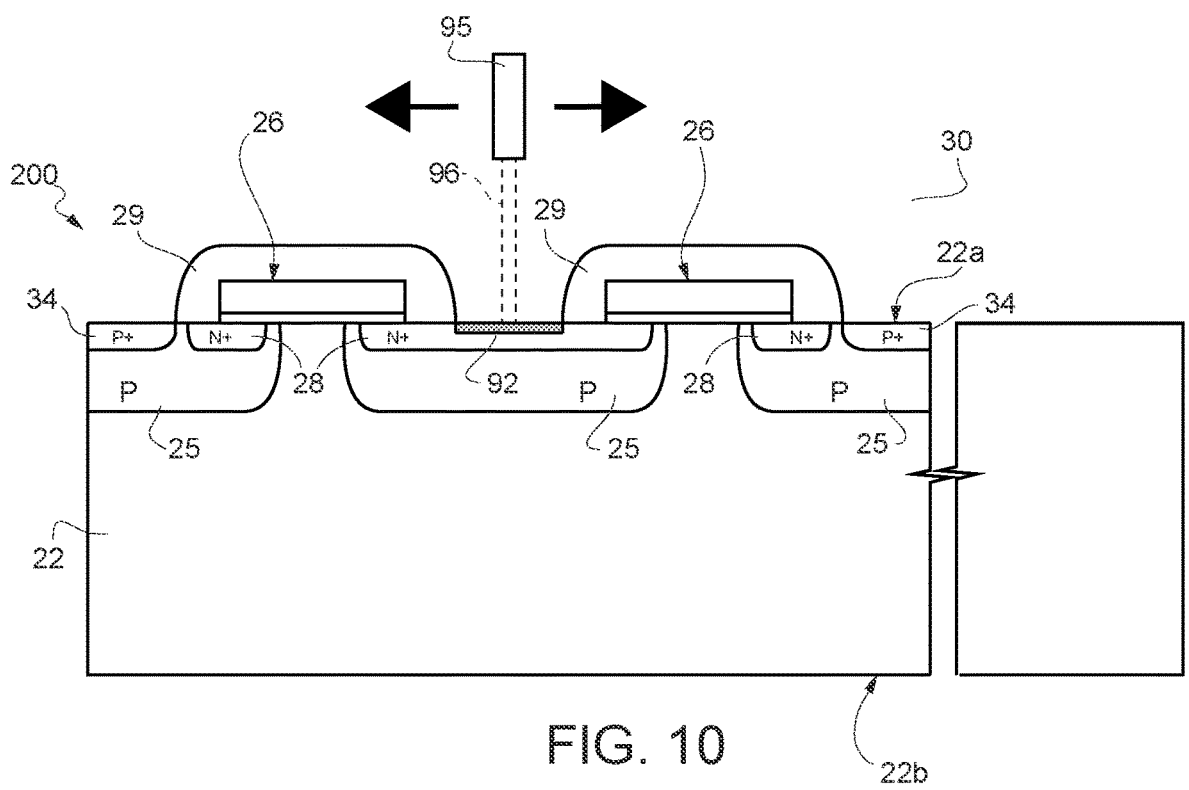
FIG. 10 illustrates, in cross-sectional view, a step for manufacturing the MOSFET device of FIG. 9, according to one embodiment of the present disclosure.

The steps of formation of the ohmic contacts 91 and 92 are described in what follows with reference to FIG. 10.

In particular, FIG. 10 shows a wafer 200, which includes the MOSFET device 90 in an intermediate manufacturing stage, in which the body region 25, the interface region 34, the source region 28, the gate structures 26 and the insulating layer 29 have been formed (in a per se known manner).

In order to form the ohmic contacts 91, 92, a thermal budget is generated on the surface 22a designed to favor generation, at the interface 34 and the source 28 regions, of the respective ohmic contact 91, 92.

For this purpose, a laser source 95 is used configured to generate a beam 96 such as to heat the surface 22a locally (in particular, the interface 34 and the source 28 regions) up to a temperature of approximately 1200° C.-2600° C.

A temperature in the aforementioned range is such as to favor generation of the carbon-rich regions and graphite/graphene layers exclusively at the interface 34 and the source 28 regions, and not at the surface region 22a, where the interface 34 and the source 28 regions do not extend.

In one embodiment, transformation of the interface region 34 and source region 28 into the respective ohmic contact is obtained by heating the entire wafer 200, moving the laser 95 appropriately.

In a further embodiment, transformation of the interface 34 and source 28 regions into the respective ohmic contact takes place by selectively heating the interface 34 and source 28 regions, by appropriately directing the beam 96.

In a further embodiment, it is possible to arrange on the wafer 200 a mask (not illustrated in the figures) having regions transparent to the beam 96 (i.e., the beam 96 traverses them) and regions opaque to the beam 96 (i.e., the beam 96 does not traverse them, or traverses them in attenuated form such as not to significantly heat the masked portions of the wafer 200). The transparent regions of the mask are aligned with the interface 34 and source 28 regions in order to enable the formation of the respective ohmic contact and protect portions of the wafer 200 in which an ohmic contact formation via the laser 95 is not envisaged.

The applicant has found that the ohmic contact 92 formation at the source region 28 (with N+ doping) requires an energy of the beam 96 different from the energy required for the ohmic contact 91 formation at the interface region 34 (with P+ doping).

Optimization of the ohmic properties of the contact 92 at the source region 28 (with N+ doping) could require an energy of the beam 96 different from the energy required for optimization of the ohmic properties of the contact 91 at the interface region 34 (with P+ doping). For this purpose, it is possible to regulate operating parameters of the laser 95 for generating a respective beam 96 at the interface region 34 and at the source region 28, each beam being designed for generating the respective layer with ohmic properties.

In any case, the applicant has found that the ohmic contact 92 formation at the source region 28 (with N+ doping) and of the ohmic contact 91 at the interface region 34 (with P+ doping) can occur given the same energy of the beam.

In detail, at the source 28 and interface 34 regions, the parameters of configuration and actuation of the laser 95, optimized for achieving the purpose of the present disclosure, are the following:

wavelength: between 290 nm and 370 nm, in particular 310 nm;

pulse duration: between 100 ns and 300 ns, in particular 160 ns;

number of pulses: between 1 and 10, in particular 2;

energy density: between (2) 1.6 and 4 J/cm$^2$, in particular (3) 2.6 J/cm$^2$ (considered at the level of the surface 22a); and temperature: between 1400° C. and 2600° C., in particular 1800° C. (considered at the level of the surface 22a).

The area of the spot of the beam 82 at the level of the surface 22a is, for example, comprised between 0.7 and 1.5 cm$^2$.

To cover the entire wafer 200 or the sub-region of the wafer 200 to be heated, one or more scans of the laser 95 are therefore performed in the plane XY (e.g., a plurality of scans parallel to one another and to the axis X and/or axis Y).

Figure 11:
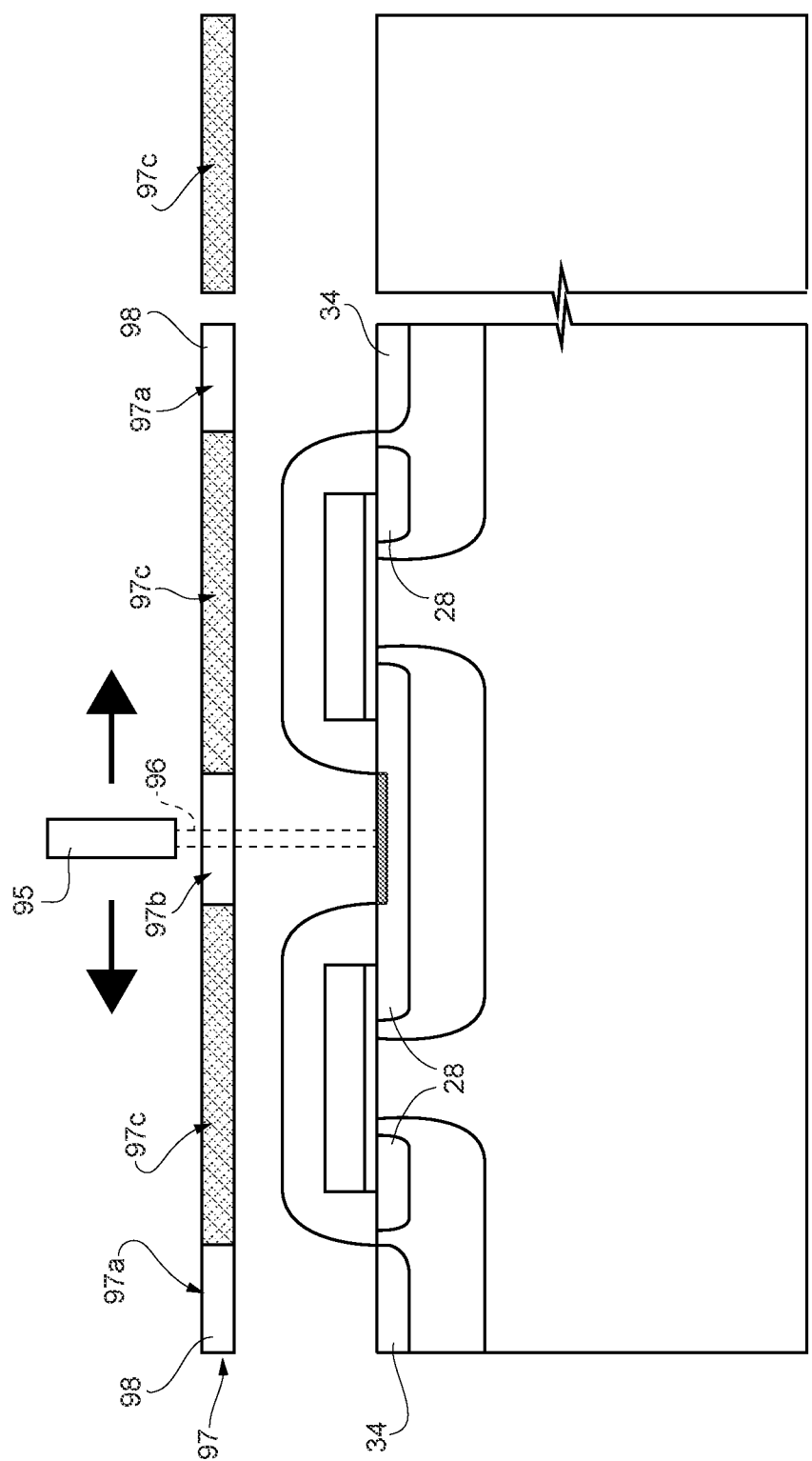
FIG. 11 illustrates, in cross-sectional view, a step for manufacturing the MOSFET device of FIG. 9, according to a further embodiment of the present disclosure.

Alternatively, FIG. 11, it is possible to arrange a mask 97 on the wafer 200, said mask being provided with respective windows 97a, 97b at (i.e., vertically aligned with) the interface region 34 and the source region 28. The remaining portions 97c of the mask 97 are completely opaque to the beam 96, i.e., they are not traversed by the beam 96 (or in any case they are traversed in a non-significant way and such as not to generate on the underlying structures of the wafer 200 a heating such as to cause damage or undesired phenomena of some other type).

The window 97a at the interface region 34 is provided with a filter 98 designed to modify characteristics of the beam 96, for example in the case where it were expedient to modify some characteristics of the beam that impinges on the interface region 34. Instead, the filter 98 is not present.

The window 97b at the source region 28 does not have any filter; i.e., it is transparent to the beam 96, which traverses it in a substantially unaltered form as regards its characteristics.

In the following of the present disclosure, it is considered that both of the windows 97a and 97b are without a filter, and that the mask 97 will have the function of protecting (via the opaque portions 97c) regions that are not to be heated with the beam 96.

In particular, in this embodiment, the beam 96 is generated by controlling the laser 95 in the following way:
  wavelength: between 290 nm and 370 nm, in particular 310 nm;
  pulse duration: between 100 ns and 300 ns, in particular 160 ns;
  number of pulses: between 1 and 10, in particular 2;
  energy density: between (2) 1.6 and 4 J/cm$^2$, in particular (3) 2.6 J/cm$^2$ (considered at the level of the surface 22a);
  temperature: between 1400° C. and 2600° C., in particular 1800° C. (considered at the level of the surface 22a).

The area of the spot of the beam 82 at the level of the surface 22a is, for example, comprised between 0.7 and 1.5 cm$^2$.

To cover the entire wafer 200, or the sub-region of the wafer 200 to be heated, one or more scans of the laser 95 are therefore performed in the plane XY (e.g., a plurality of scans parallel to one another and to the axis X and/or axis Y).

The beam 96 thus generated is directed towards the source region 28 (N+), through the window 97b, and towards the interface region 34 (P+), through the window 97a.

It is evident that, according to a further embodiment, it is possible to introduce a filter also at the window 97b, and generate the beam 96 in an appropriate way (i.e., such that the filtered beam is designed to generate the ohmic contact at the source region 28).

Since the ohmic contact is formed exclusively at the P and N implanted regions, there is a self-alignment between the interface 34/source 28 regions and the respective ohmic contact 91/92.

Transformation of the SiC into carbon-rich layers and/or graphite and/or graphene layers occurs on the basis of the technical considerations already described previously, with reference to manufacturing of the MPS device.

The laser 95 is, for example, a UV excimer laser. Other types of laser may be used, among which lasers having wavelengths in the region of the visible.

From an examination of the characteristics of the disclosure provided according to the present disclosure the advantages that it affords are evident. In particular, according to the present disclosure, it is possible, with a single process, to provide ohmic contacts on P+ or N+ regions, without any deposition of metal layers, thus overcoming the disadvantages regarding the known art identified and described previously.

Finally, it is clear that modifications and variations may be made to what has been described and illustrated herein, without thereby departing from the scope of the present disclosure, as defined in the annexed claims.

In particular, as already noted previously, the present disclosure is not limited to an ohmic contact formation of an MPS device or of a MOSFET, but extends to an ohmic contact formation in a generic vertical-conduction electronic device, such as a Schottky diode, a JBS diode, a MOSFET, an IGBT, a JFET, a DMOS, etc.

The present disclosure is directed to a method for manufacturing a SiC-based electronic device (50; 90) that includes—implanting, on a front side (52a; 22a) of a solid body (52; 22) of SiC having an N type conductivity, dopant species of a P type, thus forming an implanted region (59'; 34), which extends in the solid body starting from the front side (52a; 22a) and has a top surface coplanar with said front side (52a; 22a); and generating a first laser beam (82; 96) directed towards said implanted region (59'; 34) in order to generate heating of the implanted region (59'; 34) to temperatures comprised between 1500° C. and 2600° C. so as to form a first carbon-rich electrical-contact region (59"; 91) at said implanted region (59'; 34). The method includes forming the first ohmic contact region (59"; 91) comprises forming one or more graphene and/or graphite layers within the implanted region (59'; 34). The first laser beam (82; 96) is generated according to the following parameters: wavelength: between 290 nm and 370 nm, in particular 310 nm; pulse duration: between 100 ns and 300 ns, in particular 160 ns; number of pulses: between 1 and 10, in particular 2; and energy density: between 1.6 and 4 J/cm$^2$, in particular 2.6 J/cm$^2$.

The first electrical-contact region (59"; 34) forms a first ohmic contact having a top surface thereof coinciding with the top surface of the implanted region (59'; 34). The first electrical-contact region (59"; 91) has a thickness comprised between 1 nm and 20 nm. The material of the solid body is one of the following: 4H—SiC, 6H—SiC, 3C—SiC, 15R—SiC. The electronic device (50; 90) is one of the following: a merged-PiN-Schottky diode, Schottky diodes, JBS diodes, MOSFETs, IGBTs, JFETs, and DMOSs.

The electronic device (50) is a merged-PiN-Schottky (MPS) diode, the method comprising the steps of forming said solid body, including: arranging a SiC substrate of an N type having a front side thereof and a back side thereof opposite to one another, and epitaxially growing, on the front side of the substrate, a drift layer (52) made of SiC of an N type; forming a first electrical terminal (58) in electrical contact with the doped region (59') via the first electrical-contact region (59") and in direct electrical contact with the drift layer (52) laterally to the doped region (59') so as to form a junction-barrier (JB) diode with said doped region (59') and a Schottky diode with the drift layer (52); and forming a second electrical terminal (57) on the back side of the substrate.

The electronic device (90) is a MOSFET, the method comprising the steps of: forming, on said front side (22a) of the solid body (22), a first body region (25) of a P type; forming said implanted region (34) within the first body region (25); forming, on said front side (22a) of the solid body (22), a second body region (25) of a P type, which extends laterally to the first body region (25); forming, in the second body region (25), a source region (28) of an N type; generating a second laser beam (96) directed towards said source region (28) in order to generate heating of the source region (28) to temperatures comprised between 1500° C. and 2600° C. so as to form a second carbon-rich electrical-contact region (92) at said source region (28).

The second laser beam (96) is generated according to the following parameters: wavelength: between 290 nm and 370 nm, in particular 310 nm; pulse duration: between 100 ns and 300 ns, in particular 160 ns; number of pulses: between 1 and 10, in particular 2; and energy density: between 2 and 4 J/cm$^2$, in particular 3 J/cm$^2$. The forming the second ohmic contact region (92) comprises forming one or more graphene and/or graphite layers within the source region (28). The first electrical-contact region (59"; 34) forms a first ohmic contact having a top surface thereof coinciding with the top surface of the implanted region (59'; 34). The second electrical-contact region (59"; 91) has a thickness comprised between 1 nm and 20 nm.

The present disclosure is also directed to a SiC-based electronic device (50; 90) that includes a solid body (52; 22) made of SiC having an N type conductivity; an implanted region (59'; 34), which extends on a front side (52a; 22a) of the solid body (52; 22) and includes dopant species of a P type, said implanted region having a top surface coplanar with said front side (52a; 22a) of the solid body; and—a first carbon-rich electrical-contact region (59"; 91), which extends at said implanted region (59'; 34). The first electrical-contact region (59"; 91) comprises one or more graphene and/or graphite layers within the implanted region (59'; 34).

The first electrical-contact region (59"; 91) forms an ohmic contact having a top surface thereof coinciding with the top surface of the implanted region (59'; 34). The electrical-contact region (59") has a thickness comprised between 1 nm and 20 nm. The material of the solid body is one of the following: 4H—SiC, 6H—SiC, 3C—SiC, 15R—SiC. The device being chosen from among the following: a merged-PiN-Schottky diode, Schottky diodes, JBS diodes, MOSFETs, IGBTs, JFETs, DMOSs. The device of a merged-PiN-Schottky (MPS) diode type, wherein the solid body includes a SiC substrate of an N type having a front side thereof and a back side thereof opposite to one another, and a drift layer (52) made of SiC of an N type on the front side of the substrate, further comprising: a first electrical terminal (58) in electrical contact with the doped region (59') via the first region of ohmic contact (59") and in direct electrical contact with the drift layer (52) laterally to the doped region (59') so as to form a junction-barrier (JB) diode with said doped region (59') and a Schottky diode with the drift layer (52); and a second electrical terminal (57) on the back side of the substrate. The electronic device (90) is a MOSFET that includes a first body region (25) of a P type on said front side (22a) of the solid body (22), housing said implanted region (34); a second body region (25) of a P type, which extends on said front side (22a) of the solid body (22), laterally to the first body region (25); a source region (28) of an N type in the second body region (25); a second carbon-rich electrical-contact region (92) in said source region (28).

The second electrical-contact region (92) comprises one or more graphene and/or graphite layers within the source region (28). The device second electrical-contact region (92) forms an ohmic contact having a top surface thereof coinciding with the top surface of the source region (28). The electrical-contact region (92) has a thickness comprised between 1 nm and 20 nm.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate having a first conductivity type and a first surface opposite a second surface;
a plurality of first doped regions each having a second conductivity type and a first surface coplanar with the first surface of the substrate;
a plurality of second doped regions each in a respective one of the plurality of first doped regions, each second doped region having the first conductivity type and a first surface coplanar with the first surface of the respective first doped region;
a first gate on the first surface of the substrate that overlaps a first edge of a first of the plurality of second doped regions and a first edge of a second of the plurality of second doped regions;
a second gate on the first surface of the substrate that overlaps a second edge of the first of the plurality of second doped regions, the second edge being opposite the first edge of the first of the plurality of second doped regions along a first direction;
a metal layer on the first surface of the substrate;
an insulating layer between the metal layer and the first gate, the insulating layer entirely separating the second of the plurality of second doped regions from the metal layer; and
a first ohmic contact between the first gate and the second gate along the first direction, the first ohmic contact being in the first of the plurality of second doped regions, the first ohmic contact having a first surface coplanar with the first surface of the respective first doped region and the first surface of the first of the plurality of second doped regions, and a second surface between the first surface of the substrate and the second surface of the substrate, wherein the first ohmic contact is exclusively surrounded, in a cross-sectional view, by the first of the plurality of second doped regions except for the first surface.

2. The device of claim 1, further comprising:
a third doped region in a first of the plurality of first doped regions, the third doped region having the second conductivity type, the third doped region including the second of the plurality of second doped regions;
a second ohmic contact on the third doped region, the second ohmic contact being between the first surface and the second surface of the substrate.

3. The device of claim 2 wherein the first ohmic contact and the second ohmic contact include carbon clusters.

4. The device of claim 1 wherein material of the substrate is selected from one from among 4H—SiC, 6H—SiC, 3C—SiC, and 15R—SiC.

5. A device, comprising:
a substrate having a first surface opposite a second surface along a first direction;
a first gate on the first surface of the substrate;
a second gate on the first surface of the substrate;
a first doped region between the first and second gates along a second direction transverse to the first direction, the first doped region having a first conductivity type and a first surface coplanar with the first surface of the substrate;
a second doped region in the first doped region, between the first and second gates along the second direction, the second doped region having a second conductivity type that is different from the first conductivity type and a first surface coplanar with the first surface of the first doped region;
a third doped region having the first conductivity type and a first surface coplanar with the first surface of the substrate, the third doped region overlapping a first portion of the first gate;

a fourth doped region in the third doped region, the fourth doped region having the second conductivity type and a first surface coplanar with the first surface of the third doped region;

a fifth doped region in the third doped region, the fifth doped region having the first conductivity type and a first surface coplanar with the first surface of the third doped region, a first portion of the third doped region entirely separating the fifth doped region from the fourth doped region along the second direction; and a first ohmic contact in the second doped region, the first ohmic contact having a first surface that is coplanar with the first surface of the substrate, the first surface of the first doped region, and the first surface of the second doped region, and a second surface between the first surface of the ohmic contact and the second surface of the substrate, wherein, except for the second surface, the first ohmic contact contacts only the second doped region.

6. The device of claim 5, further comprising a dielectric layer on the first gate and the second gate, a portion of the substrate being exposed between portions of the dielectric layer between the first and second gate, the first ohmic contact being in the portion of the substrate.

7. The device of claim 6, further comprising:
a second ohmic contact in the substrate, the first gate being between the first and second ohmic contacts.

8. The device of claim 7 wherein the second ohmic contact is in the fifth doped region.

9. The device of claim 5, wherein the fifth doped region has the first conductivity type with a first concentration the third doped region having a second concentration that is different than the first concentration.

10. A device, comprising:
a silicon carbide (SiC) substrate having a first side opposite a second side along a first direction;
a first doped region with a first conductivity type on the first side of the SiC substrate having dopants of a second conductivity type, the first conductivity type being different than the second conductivity type, the first doped region extending in the SiC substrate from the first side toward the second side along the first direction, the first doped region having a first surface that is coplanar with a second surface of the first side;
a second doped region in the first doped region, the second doped region having the second conductivity type;

a first gate on the first surface that overlaps a first edge of the second doped region along the first direction, the first gate including:
a gate conductive layer with a first length along a second direction transverse to the first direction; and
a gate dielectric layer between the gate conductive layer and the first surface, the gate dielectric layer having a second length along the second direction equal to the first length;
a second gate on the first surface;
a third doped region in the first doped region, the third doped region having the first conductivity type;
a first ohmic contact on the third doped region coplanar with the second surface of the first side of the SiC substrate, a portion of the first doped region physically separating the second doped region from the third doped region and from the first ohmic contact along the second direction; and
a first carbon-rich electrical-contact region between the first gate and the second gate, the first carbon-rich electrical contact region being between the first surface and the second surface of the substrate.

11. The device of claim 10 wherein the first carbon-rich electrical-contact region includes one or more graphene layers within a fourth doped region having the first conductivity type.

12. The device of claim 10 wherein the first carbon-rich electrical-contact region includes one or more graphite layers within a fourth doped region having the first conductivity type.

13. The device of claim 10 wherein the first carbon-rich electrical-contact region has, in top plan view, a form and extension coinciding with a form and extension of a fourth doped region having the first conductivity type.

14. The device of claim 10 wherein the first carbon-rich electrical-contact region includes a second ohmic contact having a first surface coplanar with the second surface of the first side of the SiC substrate.

15. The device of claim 10 wherein the first carbon-rich electrical-contact region has a thickness in the range of 1 nm and 20 nm.

16. The device of claim 10, further comprising:
a fourth doped region between the first gate and the second gate along the second direction, the fourth doped region having the first conductivity type; and
a fifth doped region in the fourth doped region, the fifth doped region having the second conductivity type.

* * * * *